(12) United States Patent
Hamada

(10) Patent No.: US 7,132,748 B2
(45) Date of Patent: Nov. 7, 2006

(54) SEMICONDUCTOR APPARATUS

(75) Inventor: Tomoji Hamada, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/623,655

(22) Filed: Jul. 22, 2003

(65) Prior Publication Data
US 2004/0183191 A1 Sep. 23, 2004

(30) Foreign Application Priority Data
Dec. 9, 2002 (JP) ............... 2002-356953

(51) Int. Cl.
H01L 23/44 (2006.01)

(52) U.S. Cl. ............ 257/728; 257/704; 257/691; 257/678; 257/701; 257/706; 257/710; 257/758; 257/698; 257/707

(58) Field of Classification Search ............ 257/728, 257/704, 691, 678, 701, 706, 710, 758, 698, 257/707
See application file for complete search history.

(56) References Cited

U.S. PATENT DOCUMENTS 5,982,250 A * 11/1999 Hung et al. ............ 333/26
6,020,637 A * 2/2000 Karnezos ............ 257/738
6,255,739 B1 * 7/2001 Adachi et al. ............ 257/788

FOREIGN PATENT DOCUMENTS

JP 5-129462 5/1993
JP 7-50362 2/1995

* cited by examiner

Primary Examiner—Steven Loke
Assistant Examiner—Junghwa Im
(74) Attorney, Agent, or Firm—Wenderoth, Lind & Ponack, L.L.P.

(57) ABSTRACT

A semiconductor apparatus is provided in which input/output of an electric signal having a particularly high frequency is less disturbed by parasitic capacitance generated in a wiring in the semiconductor apparatus. A first through-hole wiring penetrating a first dielectric board, a second through-hole wiring penetrating a second dielectric board, and an internal wiring inserted between the first dielectric board and the second dielectric board are provided. The first through-hole wiring and the second through-hole wiring are arranged on the internal wiring while being away from each other.

19 Claims, 5 Drawing Sheets

SEMICONDUCTOR APPARATUS

BACKGROUND OF THE INVENTION

1. Field of the Invention

This invention relates to a semiconductor apparatus including a semiconductor device, used for ultra-high frequency signal processing of several GHz or more, or high-speed optical communication of several Gbps or more.

2. Description of the Related Art

Structure of a conventional semiconductor apparatus will now be briefly described.

The conventional semiconductor apparatus has a structure in which a semiconductor device is mounted on a dielectric board and is surrounded by a dielectric ring, with a metal cover mounted on the dielectric ring so as to cover the semiconductor device. Plural external electrodes for connecting with other external devices are arranged on the dielectric board. A thin metal wire is connected to the semiconductor device, and the thin metal wire is electrically connected with the external electrodes via wiring arranged on the dielectric board.

On a back side of the dielectric board having the semiconductor device mounted thereon, a metal plate for radiation is bonded, and plural through holes are formed in the dielectric board so as to connect this metal plate with the semiconductor device.

Literature 1: JP-A-5-129462

Literature 2: JP-A-7-50362

However, in the conventional semiconductor apparatus, the wiring connecting the semiconductor device with the external electrodes is formed by a conductive layer formed on the dielectric board and a single through hole, as disclosed in JP-A-7-50362. In this structure, since the conductive layer and the through hole are at right angles to each other, large parasitic capacitance is generated in the wiring. Therefore, there is a problem in that input/output of a particularly high-frequency signal between the semiconductor apparatus and an external device is difficult.

SUMMARY OF THE INVENTION

In order to solve the foregoing problem, a semiconductor apparatus according to this invention includes: a semiconductor device; a first dielectric board surrounding the semiconductor device; a second dielectric board surrounding the semiconductor device and arranged on the first dielectric board; a metal cover arranged on the second dielectric board so as to cover the semiconductor device; plural external electrodes; a first through-hole wiring penetrating the first dielectric board and electrically connected with external electrodes; a second through-hole wiring penetrating the second dielectric board and electrically connected with the semiconductor device; and internal wiring inserted between the first dielectric board and the second dielectric board. The semiconductor device is connected with the external electrodes via the first through-hole wiring, the second through-hole wiring and the internal wiring, and the first through-hole wiring and the second through-hole wiring are electrically connected with the internal wiring while being away from each other.

In this invention, the first through-hole wiring electrically connected with the external electrodes, the second through-hole wiring penetrating the second dielectric board and electrically connected with the semiconductor device, and the internal wiring inserted between the first dielectric board and the second dielectric board are provided. The semiconductor device is connected with the external electrodes via the first through-hole wiring, the second through-hole wiring and the internal wiring. The first through-hole wiring and the second through-hole wiring are electrically connected with the internal wiring while being away from each other. Therefore, the semiconductor device and the external electrodes are connected with each other by zigzag wiring, that is, nearly linear wiring, as compared with wiring bent at right angles at its mid-point. Thus, in this invention, since reduction in quantity of passed electric signal and increase in quantity of reflected electric signal at a high frequency can be restrained, input/output of electric signals between the apparatus and an external device can be performed efficiently.

DETAILED DESCRIPTION OF THE PREFERRED EMBODIMENTS

First Embodiment

Figure 1:
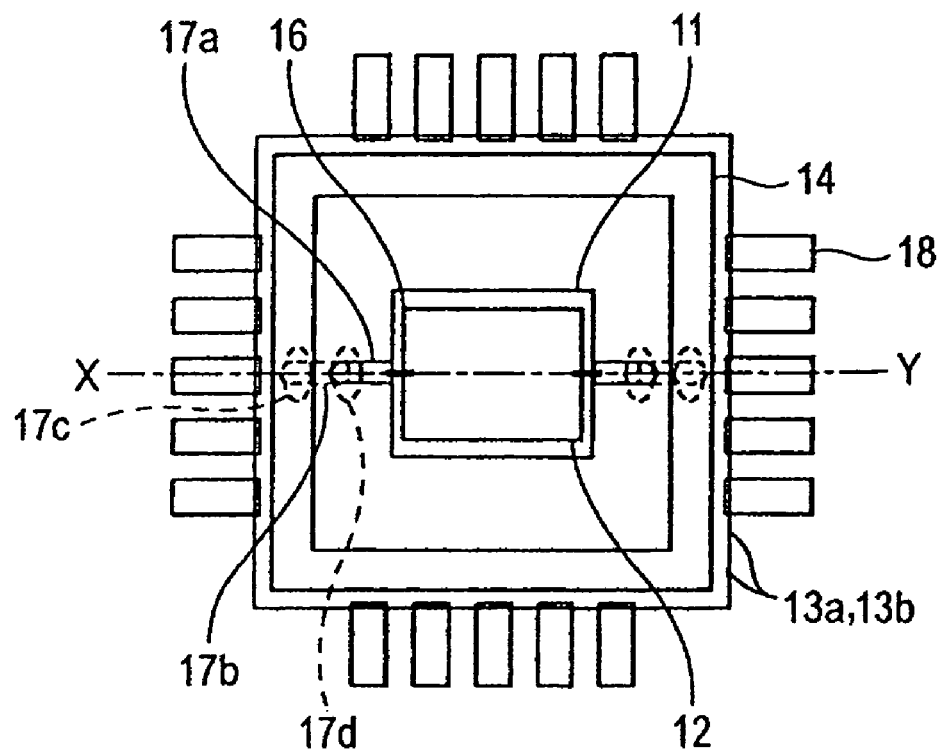
FIG. 1 is a plan view showing semiconductor apparatuses of first, second and third embodiments.
Figure 2:
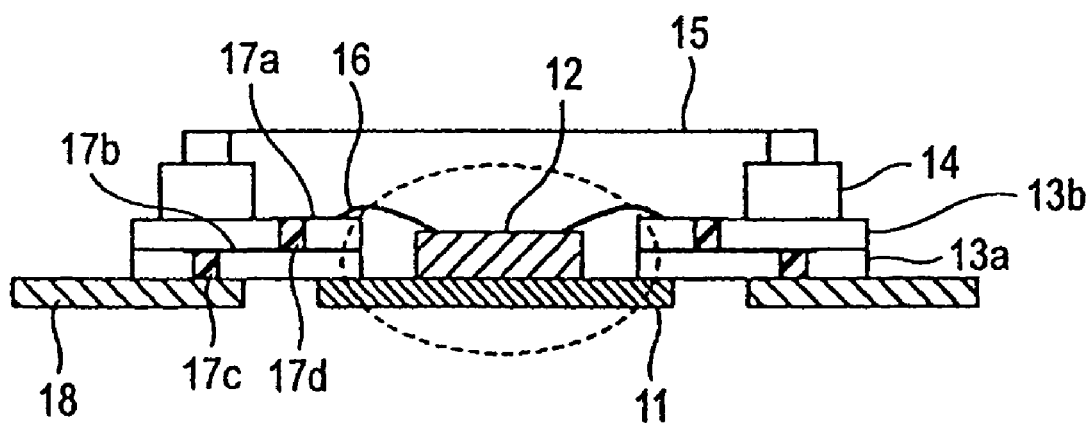
FIG. 2 is a sectional view showing the semiconductor apparatus of the first embodiment.
Figure 3:
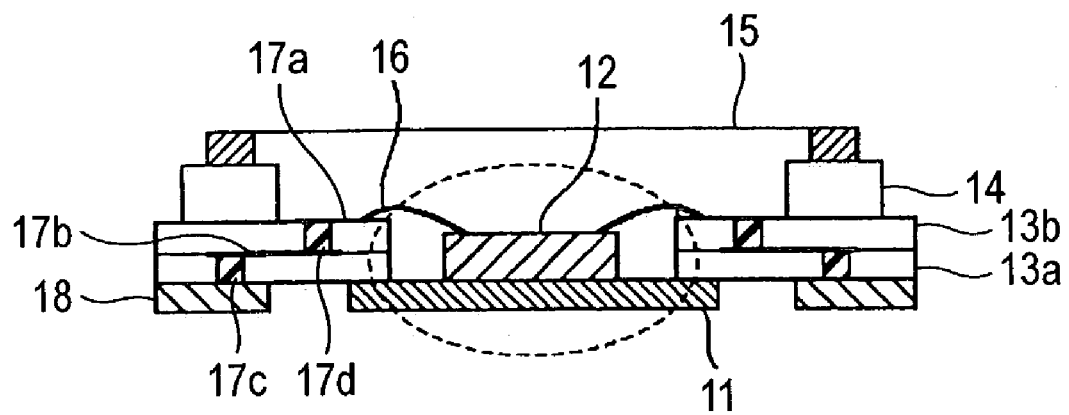
FIG. 3 is a sectional view showing a modification of the semiconductor apparatus of the first embodiment.

FIG. 1 is a plan view showing semiconductor apparatuses of first, second and third embodiments of this invention. The embodiments of this invention are the same, when shown in a plan view. Therefore, the plan view is shared in the description of these embodiments. In the plan view of FIG. 1, in order to show an internal structure of the semiconductor apparatus, a metal cover 15 is not shown. On the other hand, FIG. 2 is a sectional view showing the semiconductor apparatus of the first embodiment of this invention. FIG. 2 shows a cross section along a dotted line XY in FIG. 1. FIG. 3 is a sectional view showing a modification of the first embodiment of this invention. The first embodiment of this invention will now be described with reference to FIGS. 1, 2 and 3.

In the semiconductor apparatus of this invention, a metal plate 11 having a semiconductor device 12 mounted thereon, and lead terminals 18, equivalent to external electrodes, are arranged to be co-planar. The lead terminals 18 are for electrically connecting this semiconductor apparatus with another external device. Plural lead terminals 18 are arranged around the metal plate 11. The metal plate 11 and the lead terminals 18 have substantially the same thickness.

A first dielectric board 13*a* is arranged, extending onto the metal plate 11 and the lead terminals 18 as a common base. A second dielectric board 13*b* is superposed on the first dielectric board 13*a*. The first and second dielectric boards 13*a* and 13*b* have an aperture at their central parts, where the metal plate 11 is exposed. Where the metal plate 11 is exposed, the semiconductor device 12 is mounted. In other words, the first dielectric board 13*a* and the second dielectric board 13*b* surround the semiconductor device 12.

On the second dielectric board 13*b*, a metal cover 15 is placed via a dielectric ring 14. That is, the metal cover 15 is arranged above the semiconductor device 12.

Therefore, this semiconductor apparatus has a structure in which the semiconductor device 12 is enclosed by the metal plate 11, the first dielectric board 13*a*, the second dielectric board 13*b*, the dielectric ring 14 and the metal cover 15.

In FIG. 1, the lead terminals 18 partly protrude from the first dielectric board 13*a* and the second dielectric board 13*b*. However, if all the lead terminals 18 are arranged within outer edges of the first dielectric board 13*a* or the second dielectric board 13*b* as shown in FIG. 3, the semiconductor apparatus itself can be miniaturized. Although not shown, providing spherical or hemispherical bump electrodes as the lead terminals 18 has the same effect.

Meanwhile, upper wiring 17*a* is formed on the second dielectric board 13*b*. Internal wiring 17*b* is formed in such a manner that it is inserted between the first dielectric board 13*a* and the second dielectric board 13*b*. Moreover, in the first dielectric board 13*a* and the second dielectric board 13*b*, lower through-hole wiring 17*c* and upper through-hole wiring 17*d* are formed, respectively. The lower through-hole wiring 17*c* and the upper through-hole wiring 17*d* are equivalent to first through-hole wiring and second through-hole wiring, respectively. The lower through-hole wiring 17*c* and the upper through-hole wiring 17*d* are arranged away from each other, when they are shown in a plan view like FIG. 1 or when they are shown in a sectional view like FIG. 2 showing a cross section of a plane that overlaps the lower through-hole wiring 17*c* and the upper through-hole wiring 17*d* in the plan view.

Next, electrical connection between the semiconductor device 12 and the lead terminals 18 in the apparatus will be described. The semiconductor device 12 and the upper wiring 17*a* are connected with each other via a thin metal wire 16. The upper wiring 17*a* and the internal wiring 17*b* are connected with each other via the upper through-hole wiring 17*d*. The internal wiring 17*b* and the lead terminals 18 are connected with each other via the lower through-hole wiring 17*c*. As a result, the semiconductor device 12 and the lead terminals 18 can be electrically connected with each other in the following order: the semiconductor device 12, the thin metal wire 16, the upper wiring 17*a*, the upper through-hole wiring 17*d*, the internal wiring 17*b*, the lower through-hole wiring 17*c*, and the lead terminals 18. The upper through-hole wiring 17*d* is arranged more closely to the semiconductor device 12 than is the lower through-hole wiring 17*c*. The thin metal wire 16, the upper wiring 17*a*, the upper through-hole wiring 17*d*, the internal wiring 17*b*, the lower through-hole wiring 17*c*, and the lead terminals 18 have impedance of a constant value. Thus, a total impedance when the semiconductor device is viewed from the lead terminals is set at a specific value (for example, 50Ω).

As described above, in the first embodiment of this invention, the first through-hole wiring electrically connected with the external electrodes, the second through-hole wiring penetrating the second dielectric board and electrically connected with the semiconductor device, and the internal wiring inserted between the first dielectric board and the second dielectric board are provided. The semiconductor device is connected with the external electrodes via the first through-hole wiring, the second through-hole wiring and the internal wiring. The first through-hole wiring and the second through-hole wiring are electrically connected with the internal wiring while being away from each other. Particularly, the second through-hole wiring is arranged more closely to the semiconductor device than is the first through-hole wiring, and the semiconductor device and the external electrodes are thus electrically connected with each other. Since the first embodiment of this invention has such a structure, the semiconductor device and the external electrodes are connected with each other by zigzag wiring. The zigzag wiring described in this case represents a shape of a line bent left and right many times. An effect of connecting the semiconductor device with the external electrodes in this zigzag form will be described hereinafter.

Figure 6:
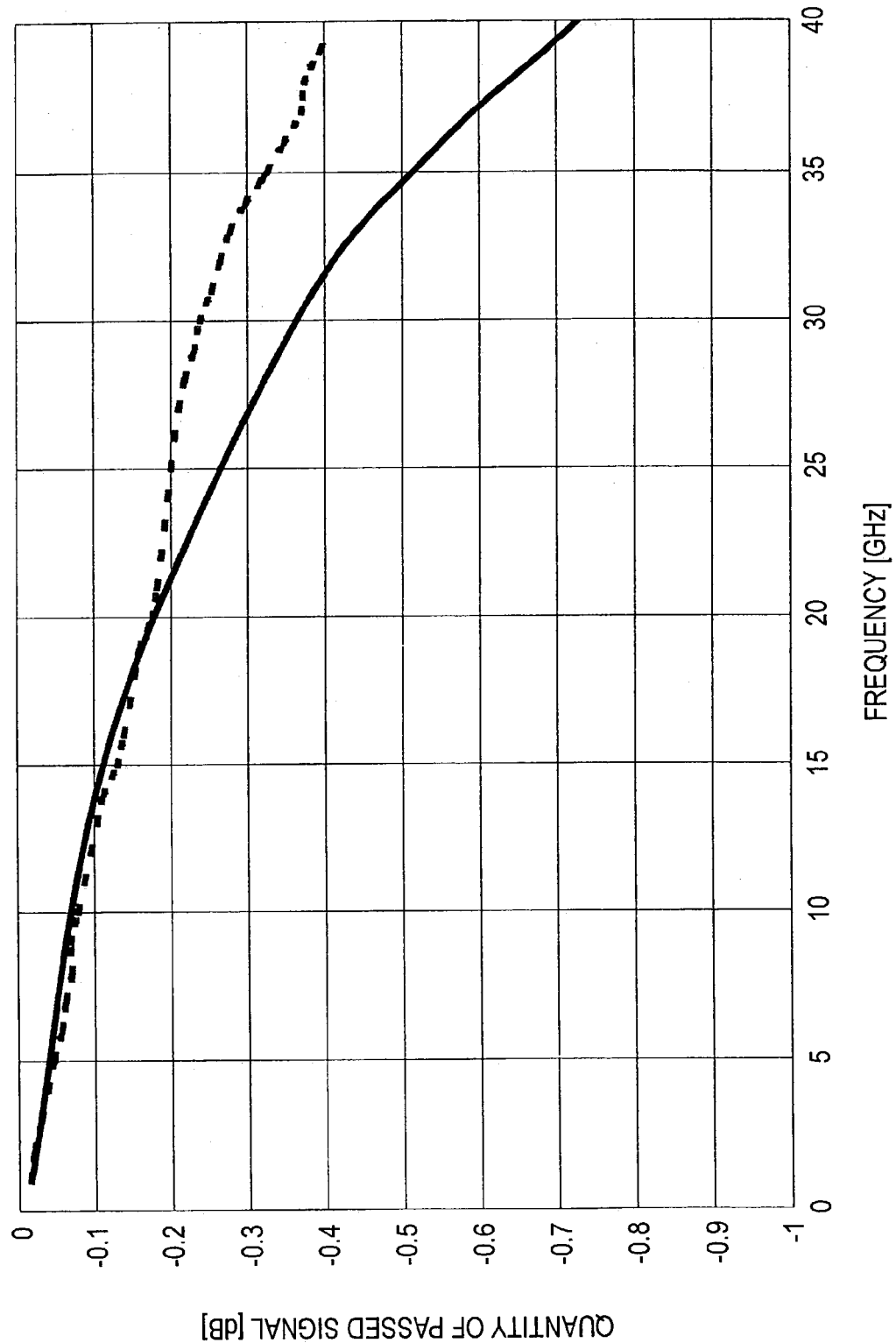
FIG. 6 shows a quantity of passed electric signal with respect to frequency in a case where a semiconductor device and external electrodes are connected with each other using one through hole, and in a case where the semiconductor device and the external electrodes are connected with each other using two through holes.
Figure 7:
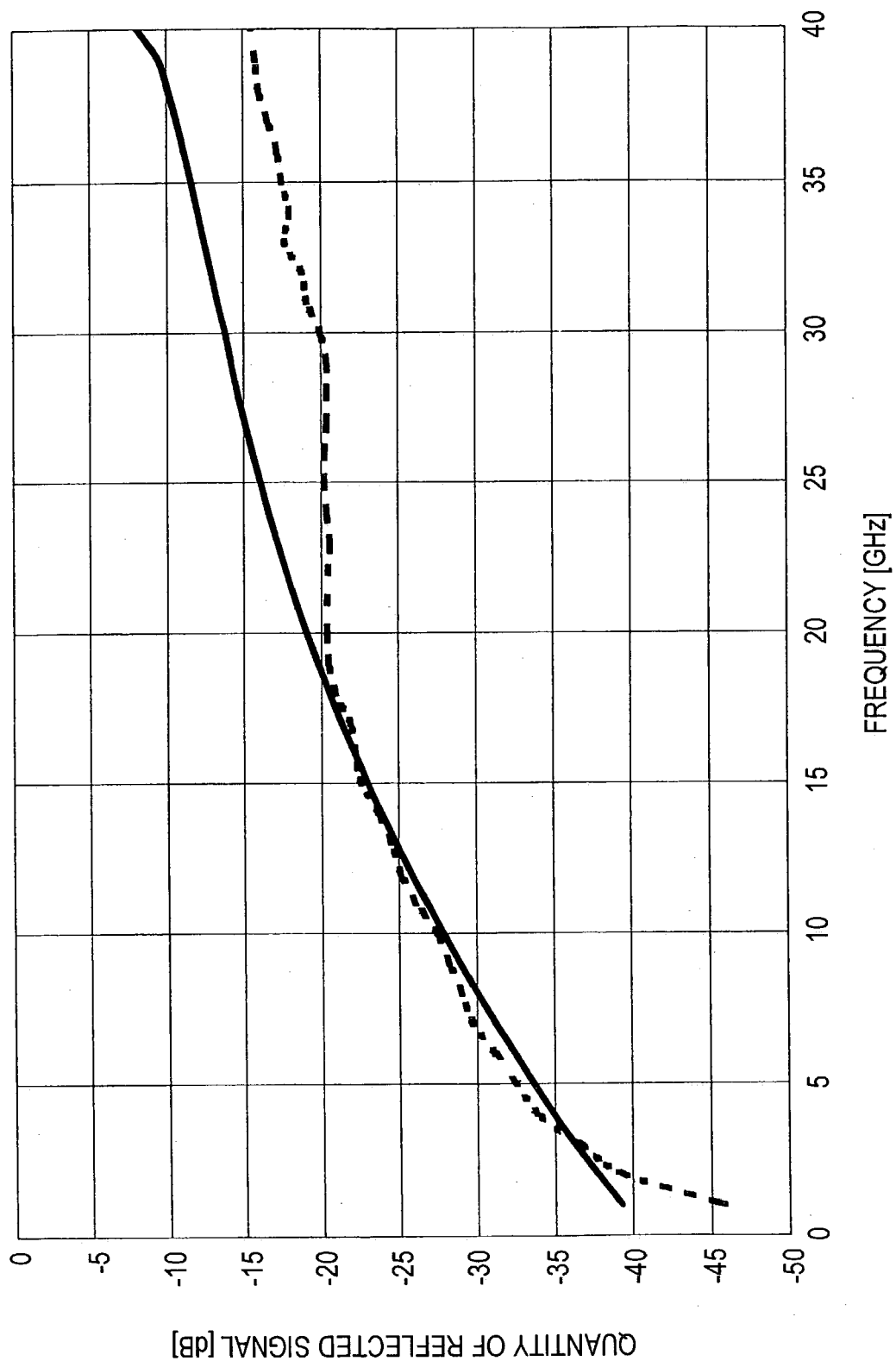
FIG. 7 shows a quantity of reflected electric signal with respect to frequency in a case where a semiconductor device and external electrodes are connected with each other using one through hole, and in a case where the semiconductor device and the external electrodes are connected with each other using two through holes.

FIG. 6 shows a quantity of passed electric signal with respect to frequency in a case where the semiconductor device and the external electrodes are connected with each other using one through hole, and in a case where the semiconductor device and the external electrodes are connected in a zigzag form using two through holes. FIG. 7 shows a quantity of reflected electric signal with respect to frequency in a case where the semiconductor device and the external electrodes are connected with each other using one through hole, and in a case where the semiconductor device and the external electrodes are connected in a zigzag form using two through holes. In FIGS. 6 and 7, a solid line represents a connection using one through hole and a dotted line represents a connection using two through holes.

In general, as frequency of an electric signal rises, a quantity of passed electric signal decreases and a quantity of reflected electric signal increases. Therefore, input/output of an electric signal between the semiconductor apparatus and an external device tends to be disturbed. However, as seen from FIGS. 6 and 7, when two through holes are used for connection, reduction in quantity of passed electric signal and increase in quantity of reflected electric signal are not very large even when frequency of the electric signal rises. A reason for this characteristic is that when the semiconductor device and the external electrodes are connected with each other using only one through hole, wiring as a whole has a shape that is bent at right angles at its mid-point. Wiring of such a shape has large capacitance in itself and therefore causes a large change in impedance with respect to the frequency. Then, as an electric signal with a high frequency passes through the wiring, a quantity of passed electric signal decreases and a quantity of reflected electric signal increases, thereby disturbing efficient input/output of the electric signal between the semiconductor apparatus and the external device. Therefore, it is desired that the semiconductor device and the external electrodes are connected with each other using wiring of a nearly linear shape.

In the first embodiment of this invention, the semiconductor device and the external electrodes are connected with each other using zigzag wiring, that is, wiring of a nearly linear shape, compared with wiring bent at right angles only once at its mid-point. Therefore, in this invention, reduction in quantity of passed electric signal and increase in quantity of reflected electric signal at a high frequency can be restrained, thereby enabling efficient input/output of electric signals between the apparatus and the external device.

Second Embodiment

Figure 4:
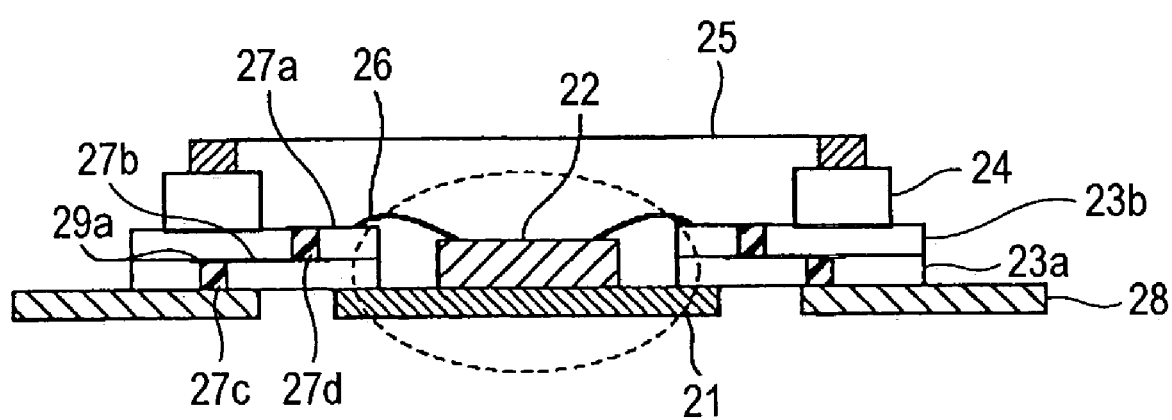
FIG. 4 is a sectional view showing the semiconductor apparatus of the second embodiment.

FIG. 1 is a plan view showing the semiconductor apparatuses of the first, second and third embodiments of this invention. FIG. 4 is a sectional view showing the semiconductor apparatus of the second embodiment of this invention. FIG. 4 shows a cross section along the line XY in FIG. 1. The second embodiment of this invention will now be described with reference to FIGS. 1 and 4.

The second embodiment of this invention differs from the first embodiment in that an upper metal layer 29a is formed on a second dielectric board 23b and under a dielectric ring 24. The upper metal layer 29a is formed together with upper wiring 27a on the second dielectric board 23b, but is not electrically connected therewith. Moreover, in the second embodiment, some of lead terminals 28 are adapted for grounding. The upper metal layer 29a is electrically connected with a lead terminal 28 for grounding and can be supplied with ground potential. This enables construction of a structure in which the upper metal layer 29a that can be supplied with ground potential is inserted between internal wiring 27b and a metal cover 25. The second embodiment of this invention has substantially the same structure as that of the first embodiment except for the above-described parts and therefore the remaining parts of the structure will not be described further in detail.

As described above, the second embodiment of this invention has substantially the same effect as that of the first embodiment. Moreover, since the metal layer connected with an external electrode for grounding is arranged between the internal wiring and the metal cover, parasitic capacitance generated between the wiring and the metal cover can be reduced when surface mounting is performed.

Third Embodiment

Figure 5:
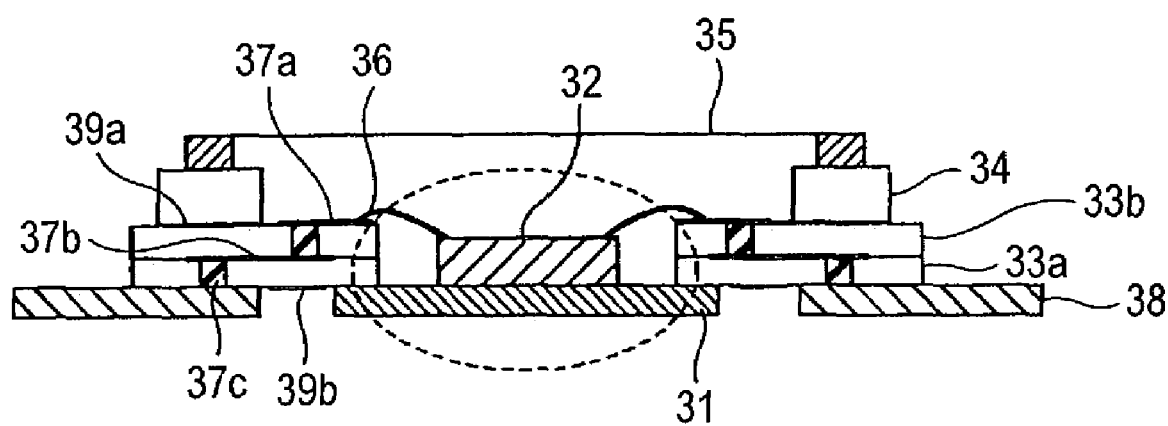
FIG. 5 is a sectional view showing the semiconductor apparatus of the third embodiment.

FIG. 1 is a plan view showing the semiconductor apparatuses of the first, second and third embodiments of this invention. FIG. 5 is a sectional view showing the semiconductor apparatus of the third embodiment of this invention. FIG. 5 shows a cross section along the line XY in FIG. 1. The third embodiment of this invention will now be described with reference to FIGS. 1 and 5.

The third embodiment of this invention differs from the second embodiment in that a lower metal layer 39b is arranged under a first dielectric board 33a. Also in the third embodiment, similar to the second embodiment, some of lead terminals 38 are adapted for grounding. The lower metal layer 39b is electrically connected with a lead terminal 38 for grounding, similarly to an upper metal layer 39a, and can be supplied with ground potential. This enables construction of a structure in which internal wiring 37b is inserted between the upper metal layer 39a and the lower metal layer 39b, both of which can be supplied with ground potential. The third embodiment of this invention has substantially the same structure as that of the second embodiment except for the above-described parts and therefore the remaining parts of the structure will not be described further in detail.

As described above, the third embodiment of this invention has substantially the same effect as that of the second embodiment. Moreover, since the metal layers connected with the top and bottom of the internal wiring are connected with an external electrode for grounding, parasitic capacitance generated in the internal wiring can be further reduced than in the second embodiment.

In the third embodiment, the parasitic capacitance can be reduced even when the upper metal layer 39a is not provided, though its effect is not so significant as in the second embodiment.

What is claimed is:

1. A semiconductor apparatus comprising:
    a semiconductor device;
    a first dielectric board surrounding said semiconductor device;
    a second dielectric board surrounding said semiconductor device and on said first dielectric board;
    a metal cover on said second dielectric board and above said semiconductor device;
    external electrodes;
    upper wiring on said second dielectric board;
    first through-hole wiring penetrating said first dielectric board and electrically connected with said external electrodes;
    second through-hole wiring penetrating said second dielectric board and electrically connected with said upper wiring; and
    internal wiring between said first dielectric board and said second dielectric board,
    wherein said semiconductor device is connected with said external electrodes via said first through-hole wiring and said internal wiring, and,
    wherein said first through-hole wiring and said second through-hole wiring are electrically connected with said internal wiring while being away from each other.

2. The semiconductor apparatus according to claim 1, wherein said second through-hole wiring is closer to said semiconductor device than is said first through-hole wiring.

3. The semiconductor apparatus according to claim 2, wherein
    said semiconductor device is connected to said upper wiring via a thin metal wire.

4. The semiconductor apparatus according to claim 3, further comprising:
    a metal plate having said semiconductor device mounted thereon,
    wherein said external electrodes and said metal plate are co-planar.

5. The semiconductor apparatus according to claim 3, wherein said external electrodes are completely arranged within an outer edge of said first dielectric board or said second dielectric board.

6. The semiconductor apparatus according to claim 3, wherein said external electrodes include an external electrode for grounding, and an upper metal layer supplied with ground potential via said external electrode for grounding is on an upper surface of said second dielectric board.

7. The semiconductor apparatus according to claim 3, wherein said external electrodes include an external electrode for grounding, and a lower metal layer supplied with ground potential via said external electrode for grounding is on a lower surface of said first dielectric board.

8. The semiconductor apparatus according to claim 4, wherein said external electrodes are completely arranged within an outer edge of said first dielectric board or said second dielectric board.

9. The semiconductor apparatus according to claim 4, wherein said external electrodes include an external electrode for grounding, and an upper metal layer supplied with ground potential via said external electrode for grounding is on an upper surface of said second dielectric board.

10. The semiconductor apparatus according to claim 4, wherein said external electrodes include an external electrode for grounding, and a lower metal layer supplied with a ground potential via said external electrode for grounding is on a lower surface of said first dielectric board.

11. The semiconductor apparatus according to claim 1, wherein said semiconductor device is connected to said upper wiring via a thin metal wire.

12. The semiconductor apparatus according to claim 11, further comprising:
   a metal plate having said semiconductor device mounted thereon,
   wherein said external electrodes and said metal plate are co-planar.

13. The semiconductor apparatus according to claim 11, wherein said external electrodes are completely arranged within an outer edge of said first dielectric board or said second dielectric board.

14. The semiconductor apparatus according to claim 11, wherein said external electrodes include an external electrode for grounding, and an upper metal layer supplied with ground potential via said external electrode for grounding is on an upper surface of said second dielectric board.

15. The semiconductor apparatus according to claim 11, wherein said external electrodes include an external electrode for grounding, and a lower metal layer supplied with a ground potential via said external electrode for grounding is on a lower surface of said first dielectric board.

16. The semiconductor apparatus according to claim 1, further comprising:
   a metal plate having said semiconductor device mounted thereon,
   wherein said external electrodes and said metal plate are co-planar.

17. The semiconductor apparatus according to claim 1, wherein said external electrodes are completely arranged within an outer edge of said first dielectric board or said second dielectric board.

18. The semiconductor apparatus according to claim 1, wherein said external electrodes include an external electrode for grounding, and an upper metal layer supplied with ground potential via said external electrode for grounding is on an upper surface of said second dielectric board.

19. The semiconductor apparatus according to claim 1, wherein said external electrodes include an external electrode for grounding, and a lower metal layer supplied with a ground potential via said external electrode for grounding is on a lower surface of said first dielectric board.

* * * * *